United States Patent
Konstadinidis et al.

(10) Patent No.: US 10,205,375 B1
(45) Date of Patent: Feb. 12, 2019

(54) AUTOMATED POWER SUPPLY SENSE LINE SELECTION

(71) Applicant: Oracle International Corporation, Redwood City, CA (US)

(72) Inventors: Georgios Konstadinidis, San Jose, CA (US); Changku Hwang, Morgan Hill, CA (US); Jin-Uk Shin, Milpitas, CA (US)

(73) Assignee: Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 15/705,929

(22) Filed: Sep. 15, 2017

(51) Int. Cl.
*H02M 3/335* (2006.01)
*H02M 1/00* (2006.01)
*G01R 19/00* (2006.01)
*H02M 3/04* (2006.01)

(52) U.S. Cl.
CPC .......... *H02M 1/00* (2013.01); *G01R 19/0038* (2013.01); *H02M 3/04* (2013.01); *H02M 3/33561* (2013.01); *H02M 2001/0025* (2013.01)

(58) Field of Classification Search
None
See application file for complete search history.

(56) References Cited

U.S. PATENT DOCUMENTS

| 8,247,993 B2 * | 8/2012 | Gong ................ H05B 33/0827 |
| | | 315/294 |
| 8,441,235 B2 | 5/2013 | Shi |
| 8,981,754 B1 | 3/2015 | Rohilla |
| 9,384,787 B2 | 7/2016 | DeCesaris |
| 2016/0190938 A1 | 6/2016 | Wang |
| 2016/0356837 A1 * | 12/2016 | Nakao ................ G01R 31/028 |
| 2017/0179816 A1 * | 6/2017 | Michal ................ H02M 3/04 |

* cited by examiner

*Primary Examiner* — Jeffrey A Gblende
(74) *Attorney, Agent, or Firm* — Meyertons, Hood, Kivlin, Kowert & Goetzel, P.C.

(57) ABSTRACT

An embodiment includes a circuit block configured to distribute a power signal to a plurality of voltage sense signals, and a voltage regulator configured to generate a regulated voltage level on the power signal. The embodiment also includes a sensing circuit configured to perform a sequence of comparisons of respective voltage levels of the plurality of voltage sense signals using a selection criterion. To perform the sequence of comparisons, the sensing circuit may be configured to select either a first voltage sense signal or a second voltage sense signal to generate a first output voltage sense signal. The sensing circuit may also be configured to select either a third voltage sense signal or a previously generated output voltage sense signal to generate a feedback signal. The voltage regulator circuit may be further configured to modify the regulated voltage level using the feedback signal.

20 Claims, 5 Drawing Sheets

AUTOMATED POWER SUPPLY SENSE LINE SELECTION

BACKGROUND

Technical Field

The embodiments disclosed herein generally relate to power management and, more particularly, to the implementation of voltage sensing circuits.

Description of the Related Art

Many electronic circuits utilize voltage regulation systems to provide power signals to circuits at one or more voltage levels. These voltage regulation systems may receive a global power signal with a first voltage level and generate a local power signal with a second voltage level. Circuits receiving power from the local power signal may alternate between time periods of high power consumption and low power consumption. In some circuits, changing between high and low periods of power consumption may cause the voltage level of the local power signal to deviate from the desired second voltage level.

Some voltage regulation systems include a feedback signal that allows the system to monitor a voltage level of a power signal within a circuit that receives the local power signal. Using this feedback signal, the voltage regulation system may make adjustments to the voltage level of the local power signal. These adjustments may compensate for voltage level deviations due to the circuit switching between the low and high periods of power consumption, allowing the voltage regulating system to maintain the voltage level of the local power signal at or near the desired second voltage level.

SUMMARY

Various embodiments of a system for a power delivery system are presented herein. One embodiment includes a circuit block configured to distribute a power signal to a plurality of voltage sense signals, and a voltage regulator configured to generate a regulated voltage level on the power signal. The embodiment also includes a sensing circuit configured to perform a sequence of comparisons of respective voltage levels of the plurality of voltage sense signals using a selection criterion. To perform the sequence of comparisons, the sensing circuit may be configured to select either a first voltage sense signal or a second voltage sense signal to generate a first output voltage sense signal. The sensing circuit may also be configured to select either a third voltage sense signal or a previously generated output voltage sense signal to generate a feedback signal. The voltage regulator circuit may be further configured to modify the regulated voltage level using the feedback signal.

In another embodiment, a method includes generating, by a voltage regulator circuit, a regulated voltage level on a power supply signal coupled to a plurality of voltage sense signals in a circuit block, and performing, by a sensing circuit, a sequence of comparisons of respective voltage levels of the plurality of voltage sense signals using a selection criterion. Performing the sequence of comparisons may comprise selecting, using a selection criterion, one of either a first voltage sense signal or a second voltage sense signal of the plurality of voltage sense signals to generate a first output voltage sense signal. Performing the sequence of comparisons may also comprise selecting one of either a last voltage sense signal of the plurality of voltage sense signals or a previously generated output voltage sense signal to generate a feedback signal, and then modifying, by the voltage regulator circuit, the regulated voltage level using the feedback signal.

An embodiment of an apparatus comprises a series of sensing stages. A first sensing stage of the series may be configured to receive a first voltage sense signal and a second voltage sense signal, and to generate a first logic signal based on respective voltage levels of the first voltage sense signal and the second voltage sense signal. The first sensing stage may also be configured to select, based on the first logic signal, one of either the first voltage sense signal or the second voltage sense signal to generate a first output voltage sense signal. A second sensing stage of the series may be configured to receive a previously generated output voltage sense signal and a third voltage sense signal, and to generate a second logic signal based on respective voltage levels of the previously generated output voltage sense signal and the third voltage sense signal. The second sensing stage may be further configured to select, based on the second logic signal, one of either the previously generated output voltage sense signal or the third voltage sense signal to generate a feedback signal.

BRIEF DESCRIPTION OF THE DRAWINGS

The following detailed description makes reference to the accompanying drawings, which are now briefly described.

Figure 1:
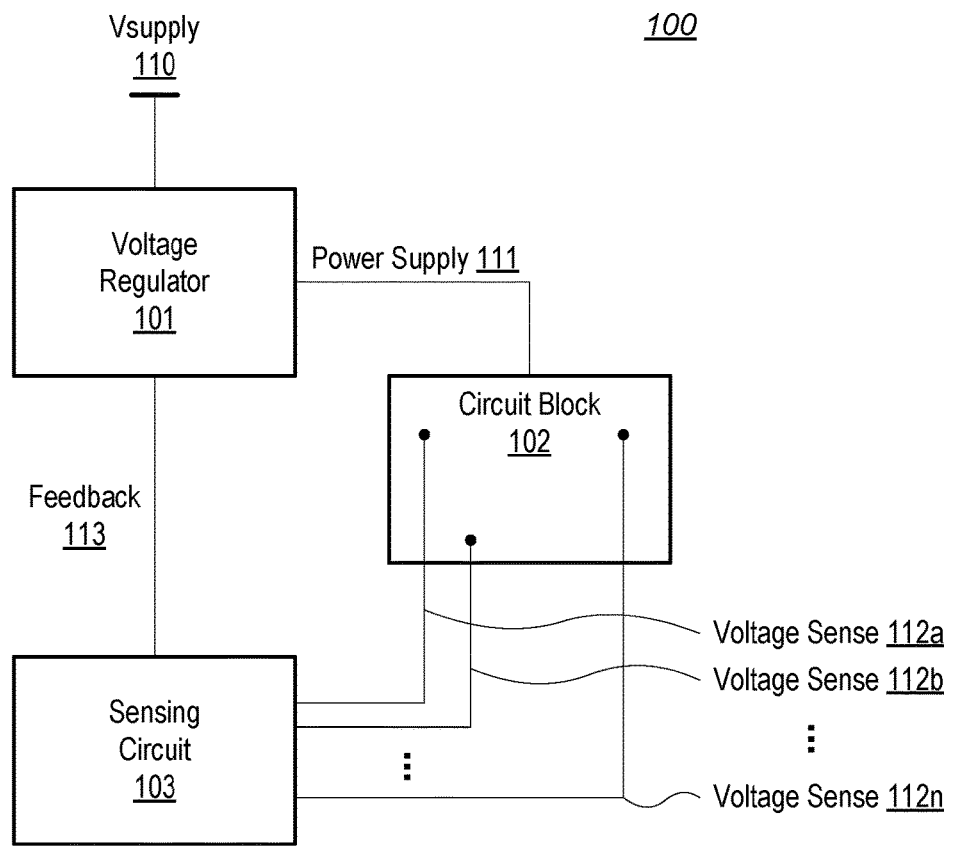
FIG. 1 illustrates a block diagram of an embodiment of a power delivery system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

A voltage regulating system may generate a power signal that is used by many circuits included in a system. Each circuit may draw various amounts of current from the power signal at various times during operation. During times of high current draw, a voltage level drop (also referred to herein as "voltage droop") may occur on the power signal. Such voltage droop, if large enough, may cause performance issues for the circuit that draws the current, as the circuit may rely on a minimum voltage level for proper operation.

A voltage regulator that generates the power signal in the voltage regulating system may include a feedback signal that allows the voltage regulator to compensate for the voltage droop by increasing a voltage level of the power signal. In some embodiments, it may be desirable to receive feedback from multiple power nodes within the system. For example, in a multi-core processor, it may be desired to receive feedback from a power node at each core or a subset of cores. Voltage levels of power signals at each of these nodes may fluctuate as the associated core, or subset of cores, enters and exits periods of high activity. To provide a minimum operating voltage level to each of the cores, identifying a lowest voltage level of the multiple power signals is desired. In other embodiments, identifying a highest voltage level of the power signals may be desired in place of, or in addition to, identifying the lowest voltage level. Embodiments disclosed below may refer to a worst case voltage level or power signal. As used herein, "worst case" refers to a voltage level of a power signal, from the power signals that are monitored, that may have a greatest impact to the voltage regulation system at a given point in time. It is noted that any particular characteristic of a power signal may be considered worst case for a given application or under particular operating conditions.

Various embodiments of systems and methods to identify and select a worst case power signal from a plurality of monitored power signals are discussed in this disclosure. The embodiments illustrated in the drawings and described below may provide techniques for identifying a power signal with a worst case voltage level, and then coupling the identified power signal to a feedback input of a voltage regulation system.

A block diagram illustrating an embodiment of power delivery system is illustrated in FIG. 1. Power delivery system 100 includes voltage regulator 101, coupled to circuit block 102 via power supply signal 111. Circuit block 102 is further coupled to sensing circuit 103 via voltage sense signals 112a-112n (referred to collectively as voltage sense signals 112). Sensing circuit 103 is further coupled to voltage regulator 101 via feedback signal 113.

In the illustrated embodiment, voltage regulator 101 receives power supply signal Vsupply 110 as an input and generates power supply signal 111 with a regulated voltage level that is at or near a target voltage level. In various embodiments, voltage regulator 101 may include a buck regulator circuit, a boost regulator circuit, a switching capacitor regulator circuit, or any suitable circuit that may be used to generate a regulated power supply signal. Voltage regulator 101 compares a voltage level of feedback signal 113 to an expected voltage level, and may adjust the regulated voltage level of power supply signal 111 if the level of feedback signal 113 deviates from the expected level. For example, voltage regulator 101 may compare the voltage level of feedback signal 113 to the voltage level of power supply signal 111. If the level of feedback signal 113 is less than the level of power supply signal 111, then voltage regulator 101 increases the voltage level of power supply signal 111 based on a difference between the two voltage levels. In some embodiments, if the voltage level of feedback signal 113 is higher than the voltage level of power supply signal 111, then voltage regulator 101 may similarly decrease the regulated voltage level of power supply signal 111 accordingly. In other embodiments, voltage regulator 101 may compare the level of feedback signal 113 to a different reference voltage than power supply signal 111.

It is noted that some embodiments of a voltage regulator circuit may not generate a power signal with a consistent regulated voltage level. Some regulation schemes may result in a power signal with a varying voltage level that swings above and below the target voltage level. Such output variations may be referred to as "voltage ripple." A voltage regulator circuit may be considered to be generating the power signal at the target voltage level when the voltage swings above and below the target voltage level deviate by less than a threshold amount.

Circuit block 102, in the illustrated embodiment, receives power supply signal 111 from voltage regulator 101 for use as a power supply. In various embodiments, circuit block 102 may correspond to any suitable type of electrical circuit, such as, for example, various circuits comprising a computing system, a multi-core processor, a networking processor, a graphics processor, a plurality of amplifier circuits, one or more memory circuits, or any suitable combination thereof. Circuit block 102 may include circuits implemented on multiple circuit boards, circuits included on a single integrated circuit (IC), or a combination of the two. In various embodiments, any combination of voltage regulator 101, circuit block 102, and sensing circuit 103 may be included on a single IC.

Circuit block 102, in the illustrated embodiment, distributes power from power supply signal 111 to various sub-circuits included in circuit block 102. Some sub-circuits may include a power switch that allows the sub-circuit to be decoupled from power supply signal 111 when the sub-circuit is not in use. In addition, some sub-circuits may include one or more circuit elements coupled between the sub-circuit and power supply signal 111. In these cases, impedance between a particular sub-circuit and power supply signal 111 may be present, resulting in a local power supply signal for the particular sub-circuit. This impedance may result in a voltage droop in the local power supply signal as compared to power supply signal 111. To detect such localized voltage droops, circuit block 102 includes voltage sense signal 112a-112n. Voltage sense signals 112a-112n are coupled to respective local power supply signals within circuit block 102. While three voltage sense signals are illustrated in FIG. 1, any suitable number may be utilized in other embodiments.

Sensing circuit 103 receives voltage sense signals 112. In the illustrated embodiment, sensing circuit 103 performs a sequence of voltage level comparisons by comparing two of voltage sense signals 112 (e.g. 112a and 112b), and then selecting one based on one or more selection criteria. As used herein, "selection criteria" or a "section criterion" refers to any characteristic of the sense signals that may be compared. For example, in the illustrated embodiment, the selection criterion may correspond to a voltage level of the compared signals, and a voltage sense signal 112 with a worst case voltage level may be selected as an output voltage sense signal. In various embodiments, the selection criterion may correspond to a lowest voltage level, a highest voltage level, a noisiest voltage level, or the like. After selecting one of the two compared voltage sense signals 112, sensing circuit 103 compares the selected voltage sense signal 112 to a third voltage sense signal 112c (not shown). Again, the voltage sense signal with the worst case voltage level is selected as an output signal. Sensing circuit 103 may repeat comparisons between a currently selected voltage sense signal 112 to a yet to be compared voltage sense signal 112 until all voltage sense signals 112 have been compared. Sensing circuit 103 selects the worst case voltage sense signal 112 to use as feedback signal 113.

Voltage regulator 101 then uses feedback signal 113, as described above, to modify, if necessary, the voltage level of power supply signal 111. By using the voltage sense signal 112 with the worst case voltage level, voltage regulator 101 may be designed with a target voltage level that is closer to a desired voltage level. For example, to conserve power, it may be desirable to use a target voltage level that is close to a minimum operational voltage level. If an average voltage level of voltage sense signals 112 were used, rather than the worst case (lowest in this example), then the target voltage level may have to be set to a higher voltage level to provide an adequate guard band or suitable operating margin for circuits operating near the lowest voltage level to help avoid having the voltage level of these circuits falling below the minimal operating voltage level. By selecting the voltage sense signal 112 with the lowest voltage level, voltage regulator 101 makes adjustments to the voltage level of power supply signal 111 based on the lowest monitored voltage level, rather than the higher average voltage level in which the lowest voltage level may be unknown.

It is noted that FIG. 1 is merely an example. The illustrated embodiment only includes components necessary to demonstrate the disclosed concepts. In other embodiments, additional components may be included. Although three voltage sense signals are shown, any suitable number of voltage sense signals may be utilized.

Figure 2:
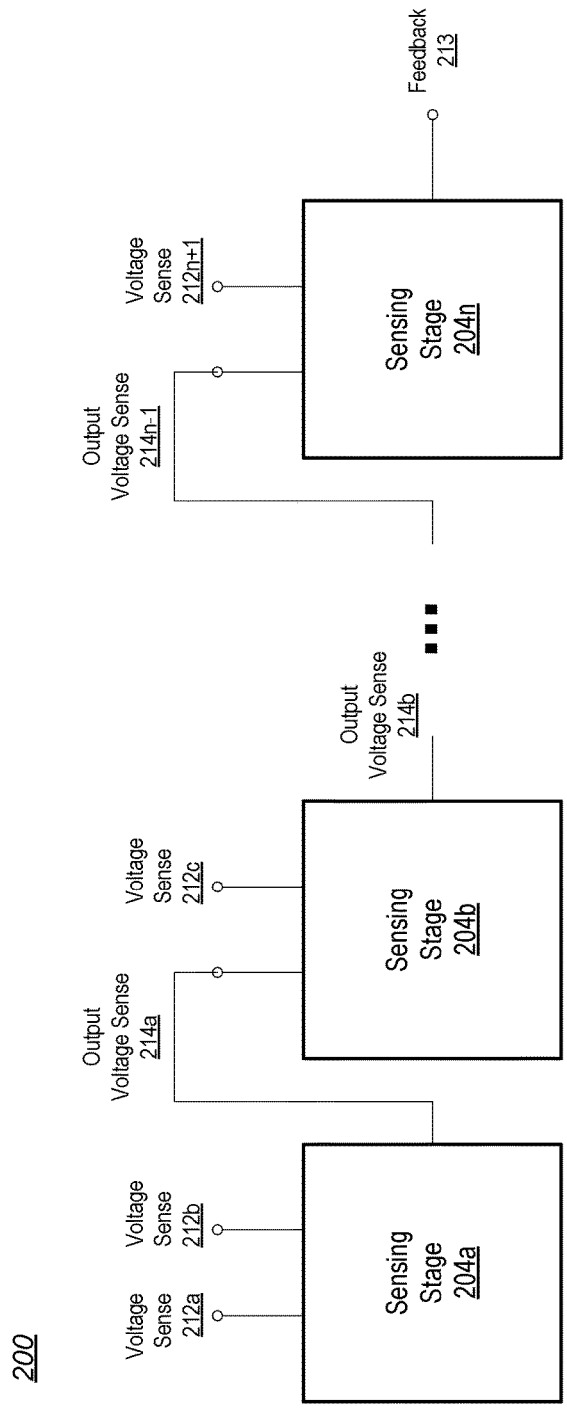
FIG. 2 shows a block diagram of an embodiment of a voltage sensing system.

Details of a voltage sensing system, that corresponds to, for example, sensing circuit 103 in FIG. 1, are disclosed in FIG. 2. Voltage sensing system 200 includes a series of sensing stages 204a-204n, referred to collectively as sensing stages 204. Each sensing stage 204 receives two voltage sense signals from a plurality of voltage sense signals 212a-212n, as inputs. Each sensing stage 204 selects one of the two as an output voltage sense signal that is used as in input by a next sensing stage 204 in the series. The output voltage sense signal from the last stage in the series, sensing stage 204n, is used as feedback signal 214. In some embodiments, voltage sense signals 212 may correspond to voltage sense signals 112, and feedback signal 213 may correspond to feedback signal 113, from FIG. 1.

Sensing stages 204 select a respective output voltage sense signal from the two input voltage sense signals using at least one selection criterion. For example, sensing stage 204a receives voltage sense signal 212a and voltage sense signal 212b. If the selection criterion corresponds to a lowest voltage level, then sensing stage 204a selects either voltage sense signal 212a or voltage sense signal 212b bases on which signal has a lower voltage level at the time of the selection. The selected voltage sense signal is passed on to the next stage (sensing stage 204b) as output voltage sense signal 214a. Sensing stage 204b compares the received output voltage sense signal 214a to another voltage sense signal (voltage sense signal 212c) and selects the signal with the lower voltage level as output voltage sense signal 214b. The process continues until the last stage (sensing stage 204n) receives the previously selected signal (output voltage sense signal 214n-1) and compares to a last sense signal (voltage sense signal 212n+1) and selects the one with the lower voltage level as feedback signal 213.

Any suitable number of sensing stages 204 may be utilized. 'N' number of stages may be used to compare and select from 'N+1' number of voltage sense signals 212, where N corresponds to a positive integer. Although lowest voltage level is used as the selection criterion in the example, other criterion may be used in other embodiments, such as, for example, highest voltage level, lowest or largest voltage swings, lowest or highest average voltage level over a time period, and the like.

It is noted that the embodiment of FIG. 2 is merely an example and circuit blocks are limited to emphasize the functionality of a voltage sensing system. In other embodiments, additional and/or different circuit blocks may be included.

Figure 3:
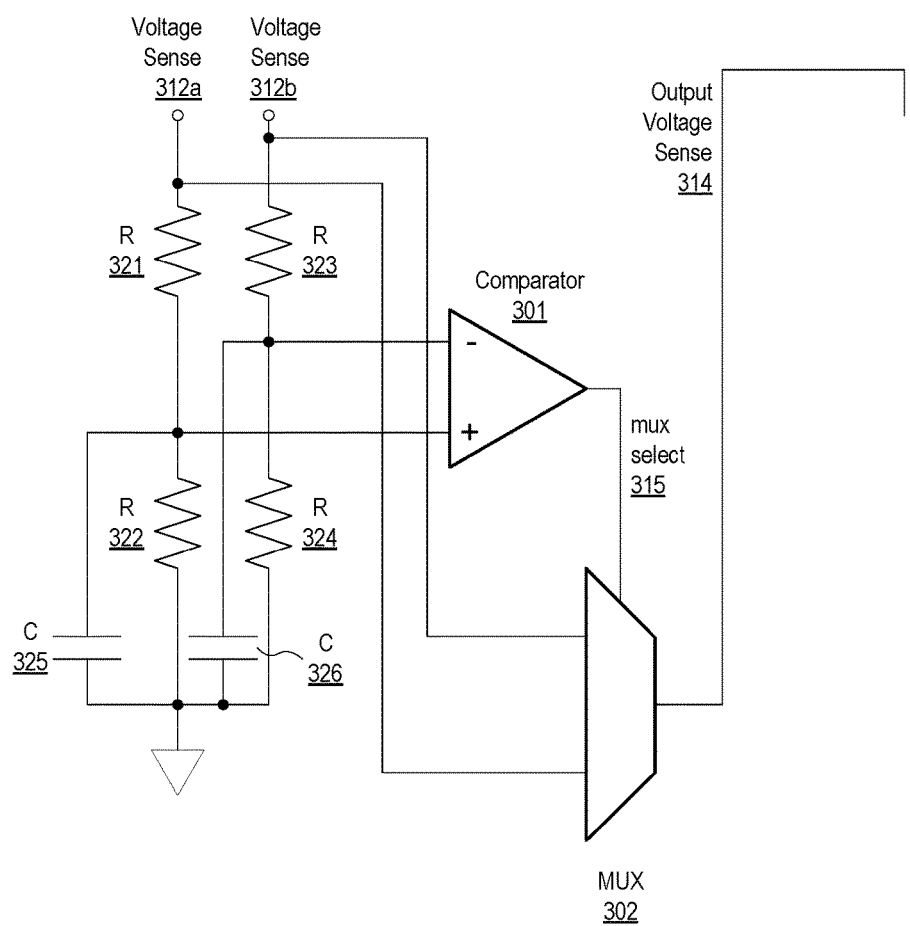
FIG. 3 depicts a circuit diagram of a particular stage of an embodiment of a voltage sensing system.

Moving to FIG. 3, a circuit diagram of a voltage sensing stage, such as, for example, one of sensing stages 204 in FIG. 2, is depicted. Voltage sensing stage 300 includes comparator circuit 301 coupled to multiplexor circuit (MUX) 302. Comparator 301 is further coupled to resistors R321 through R324 and capacitors C325 and C326. Voltage sensing stage 300 receives voltage sense signals 312a and 312b, and generates output voltage sense signal 314.

In the illustrated embodiment, voltage sensing stage 300 may correspond to any one of sensing stages 204 in FIG. 2. Accordingly, voltage sense signals 312a and 312b may correspond to any pair of voltage sense signals used as inputs to a respective sensing stage 204. Comparator 301 compares two voltage levels that correspond to voltage sense signals 312a and 312b and generates a logic output signal, mux select 315, based on a selection criterion of the comparison. Mux select 315 is coupled to a control input of MUX 302 and a logic state of mux select 315 determines if voltage sense signal 312a or voltage sense signal 312b is selected as the output of MUX 302. For example, in one embodiment, comparator 301 may generate a logic high output on mux select 315 when a voltage level of the '+' input is greater than a voltage level of the '−' input. If the selection criterion corresponds to a lowest voltage level, then this logic high on mux select 315 may cause MUX 302 to generate output voltage sense signal 314 based on voltage sense signal 312b. If, in contrast, the selection criterion corresponds to a highest voltage level, then the inputs to MUX 302 may be swapped such that MUX 302 generates output voltage sense signal 314 based on voltage sense signal 312a when the voltage level of the '+' input is greater than the voltage level of the '−' input.

A resistor divider network is created in the illustrated embodiment by R321 and R322 that scales down a voltage level of voltage sense signal 312a. A similar resistor divider network including R323 and R324 scales a voltage level of voltage sense signal 312b. The voltage levels of these voltage sense signals may be scaled down in order to produce voltage levels that are in a mid-point of an input voltage range of comparator 301. By scaling these input voltage levels down below a voltage level of a regulated power supply signal coupled to voltage sense signals 312a and 312b, the design of comparator 301 may be simplified, thereby reducing a component count and allowing more voltage sensing stages to be included in a power delivery system such as, e.g., power delivery system 100 in FIG. 1. To avoid scaling one of voltage sense signals 312 more than the other, R321 and R323 may have similar designs to produce match amounts of resistance. R322 and R324 may also have similar designs for this reason.

Capacitor C325, in combination with resistor R321, forms a low-pass filter for voltage sense signal 312a in the illustrated embodiment. This low-pass filter may attenuate one or more frequency components present in voltage sense signal 312a. Capacitor C326, in combination with R323, performs a similar function for voltage sense signal 312b. As disclosed above, a voltage regulator circuit may produce a power supply signal with a voltage level that oscillates above and below the target voltage level. This oscillation may have a particular frequency that is dependent on a design of the regulator circuit. By including the low-pass filter, these voltage level oscillations may be attenuated such that their impact to a voltage level comparison made by comparator 301 is reduced. In addition, in a closed-loop voltage regulation system in which the regulated voltage level of the power supply signal is modified based on a feedback signal, if an increase in the regulated voltage level reaches the feedback signal too quickly, then the voltage regulator may detect the sudden rise in the level of the feedback signal and attempt to compensate by reducing the voltage level, which is then detected and the process repeats, potentially creating an oscillation in the power supply signal. The inclusion of the low-pass filters may, therefore, stabilize the voltage level of the power supply signal by filtering out short-term changes in the voltage sense signals due to the changes in the regulated voltage level. Furthermore, brief voltage level spikes that may be created by the operations of circuits such as those included in circuit block 102 of FIG. 1, may also be attenuated, thereby allowing for a more accurate comparison between voltage sense signals 312.

Comparator 301 may correspond to any suitable circuit capable of comparing voltage levels of two analog input signals and generating a logic output signal based on this comparison. In some embodiments, comparator 301 corresponds to a differential input operational amplifier (Op Amp) coupled to one or more logic gates. The Op Amp generates an analog output signal based on a difference between the two voltage sense signals 312a and 312b, for example, amplifying the difference. This analog output signal is sent to at least one logic gate to generate a logic output. Two or more logic gates, such as inverters, for example, may be arranged in series to generate mux select 315 with acceptable voltage levels to represent logic high and logic low states that enable MUX 302 to determine which voltage sense signal 312 to select.

MUX 302 may be implemented as any suitable multiplexing circuit. In addition, MUX 302 may be designed such that output voltage sense signal 314 is generated with voltage levels that match the selected voltage sense signal 312 as closely as possible. If there is a voltage difference between the voltage level of the selected voltage sense signal 312 and the voltage level of output voltage sense signal 314, then a comparison between output voltage sense signal 314 and another voltage sense signal at a next voltage sensing stage may be distorted, and a voltage sense signal with the worst case voltage level may not be properly selected as a feedback signal.

The use of a comparator and a multiplexor in the sensing stages may, in some embodiments, provide for a more accurate feedback signal as compared to some other methods. For example, another embodiment may utilize an analog-to-digital converter circuit (ADC) and a digital-to-analog converter circuit (DAC). Such an embodiment may measure, using the ADC, a voltage level of each voltage sense signal, generating respective digital values that each represent a corresponding voltage level. A worst case digital value may be selected and used as an input to the DAC to generate a feedback signal that represents the worst case measured voltage level. Quantization error inherent in ADCs and DACs may, however, result in a feedback signal with a voltage level that differs somewhat from the corresponding voltage sense signal. Reducing effects of quantization error in such designs may result in large ADC and/or DAC circuit designs that use additional silicon area and consume additional power. The multiplexor circuits used in voltage sensing stage 300 of FIG. 3 may be designed to reduce error between the selected voltage sense signal and the feedback signal. In addition, the selected voltage sense signal, in the illustrated embodiment, is maintained as an analog signal through each voltage sensing stage, up to and including, generation of the feedback signal, thereby avoiding quantization error during the voltage sense signal selection process. The comparators and multiplexor circuits used in the illustrated embodiment, may, therefore, may produce a more accurate feedback signal while using less silicon area and less power, even when multiple sensing stages are utilized.

It is noted that the circuit of FIG. 3 is merely an example. In other embodiments, additional components may be included. For example, additional capacitors may be utilized top provide further signal noise filtering.

Figure 4:
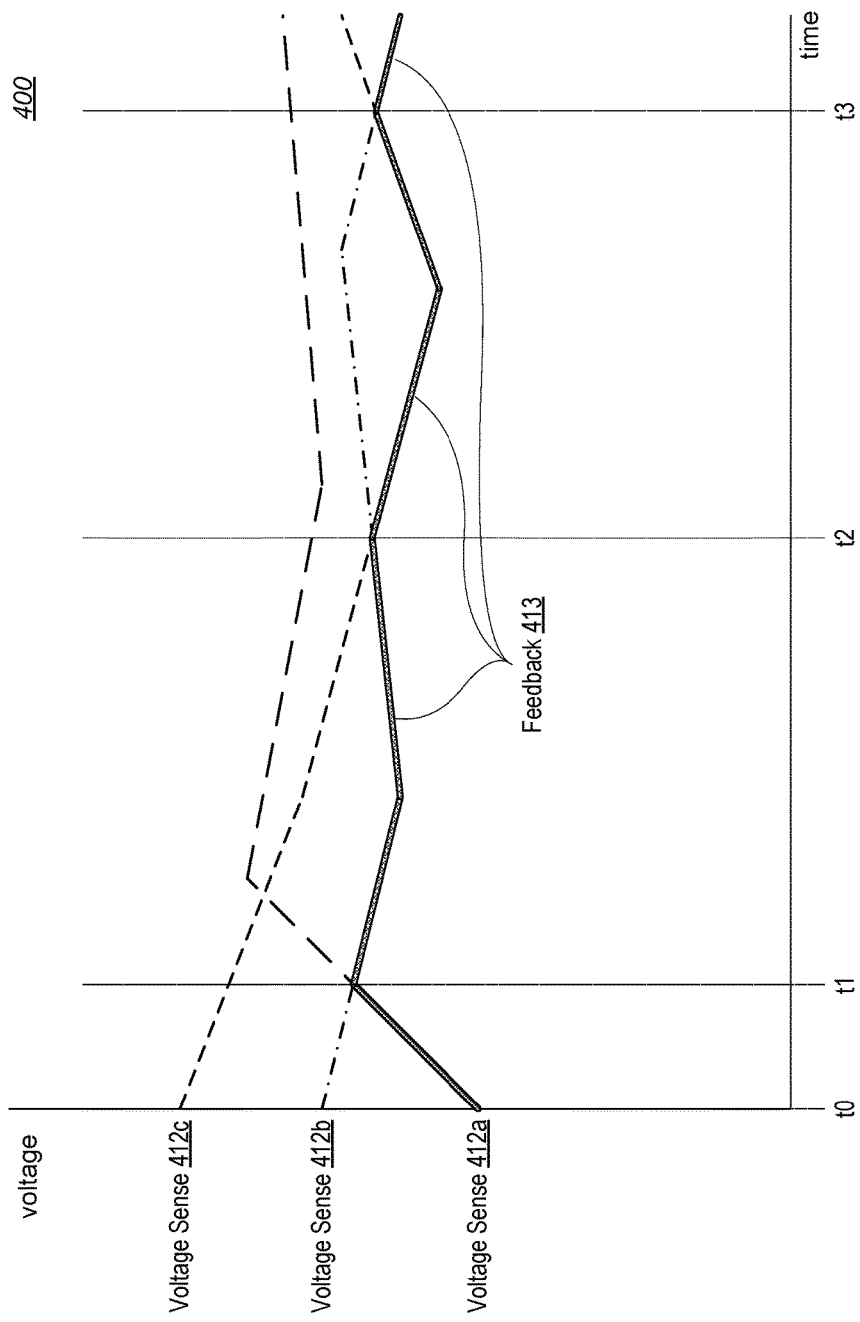
FIG. 4 illustrates an embodiment of a chart of signals associated with a voltage sensing system.

Moving to FIG. 4, an embodiment of a chart of showing signals associated with a power delivery system, such as power delivery system 100 in FIG. 1, is illustrated. Chart 400 shows three signals: voltage sense signals 412a-412c, each with a different dashed line pattern. In addition, feedback signal 413, which corresponds to a selected one of voltage sense signals 412 at a particular time, is shown as a bold line on top of corresponding segments of voltage sense signals 412.

Voltage sense signals 412, in the illustrated embodiment, may correspond to a subset of voltage sense signals 112 in FIG. 1. Therefore, these signals represent voltage levels of the respective voltage sense signal 112 corresponding to a local power supply signal in circuit block 102. From time t0 to t1, voltage sense signal 412a has the lowest voltage level of the three sense signals. Sensing circuit 103, therefore, selects voltage sense 412a as feedback signal 413. In addition, the voltage level of voltage sense signal 412a is rising and the voltage level of voltage sense signal 412b is falling. At time t1, the levels of voltage sense signals 412a and 412b cross, and once the voltage level of voltage sense signal 412b is determined to be less than that of voltage sense signal 412a, sensing circuit 103 selects voltage sense signal 412b as feedback signal 413. At time t2, the voltage levels of voltage sense signals 412b and 412c cross, and sensing circuit 103 then selects voltage sense signal 412c as feedback signal 413. At time t3, the voltage level of voltage sense signal 412b crosses back over the voltage level of voltage sense signal 412c, and sensing circuit 103 again selects voltage sense signal 412b as feedback signal 413.

As can be seen in chart 400, the voltage level of feedback signal 413 is indicative of the voltage level of the voltage sense signal 412 with the lowest voltage level. It is noted that, as used herein, phrases such as "selecting signal A as signal B" and "selecting signal A to generate signal B" are used interchangeably to indicate that a voltage level of signal B is substantially the same as a voltage level of signal A when signal A is selected.

It is noted that the chart 400 of FIG. 4 is merely an example. The signal waveforms shown in chart 400 have been simplified for clarity. In other embodiments, the signal waveforms may differ based on a technology used to implement the described circuits as well as based on current operating conditions such as, e.g., power supply voltage and operating temperature.

Figure 5:
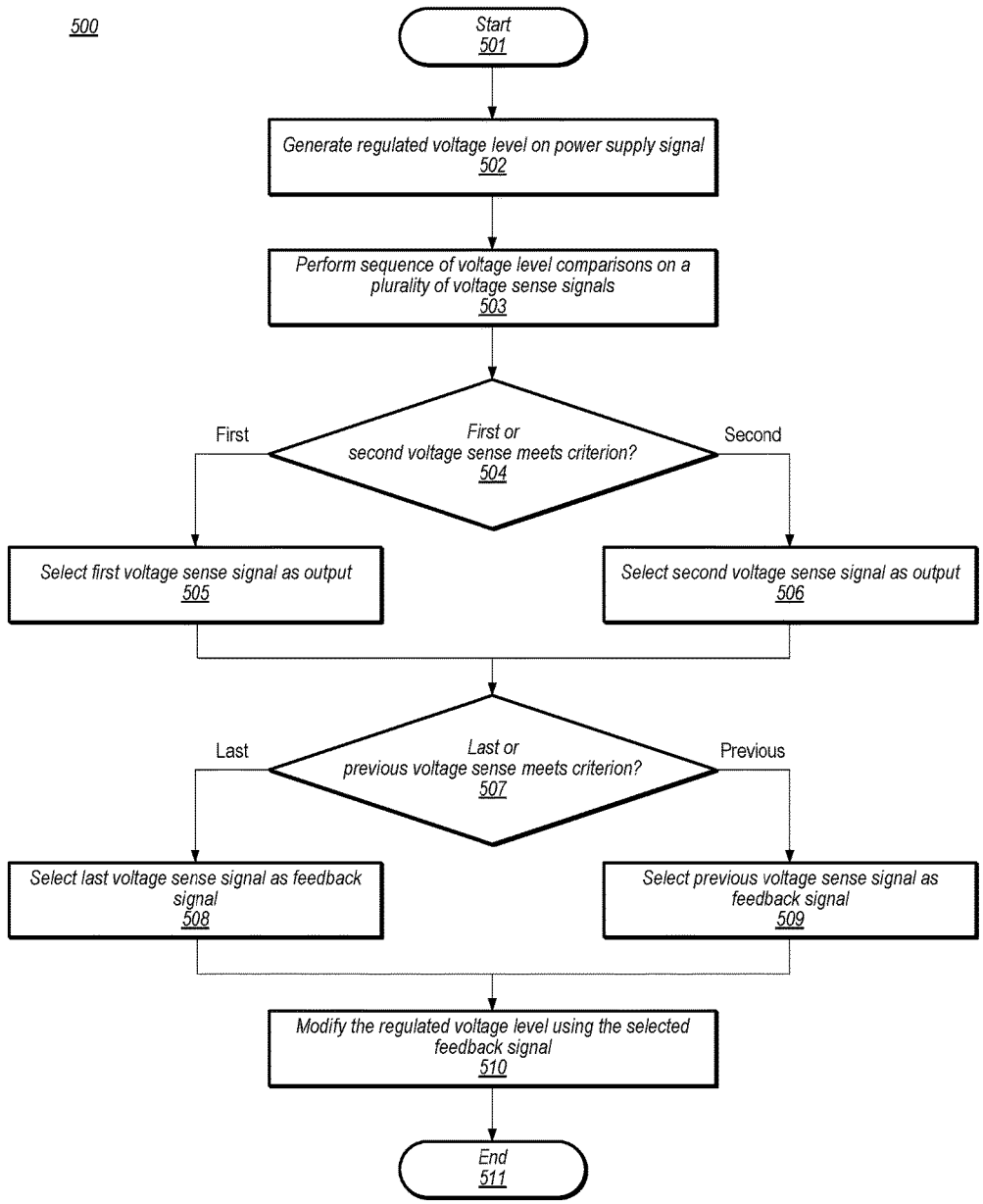
FIG. 5 shows a flow diagram of an embodiment of a method for selecting a voltage sense signal in a power delivery system.

Proceeding to FIG. 5, a flow diagram of an embodiment of a method for selecting a voltage sense signal in a power delivery system, such as, for example, power delivery system 100 in FIG. 1, is depicted. Referring collectively to FIGS. 1 and 5, method 500 begins in block 501.

A voltage regulator circuit generates a regulated voltage level on a power supply signal (block 502). In the illustrated embodiment, a voltage regulator circuit, such as, for example, voltage regulator 101, generates power supply signal 111 with a regulated voltage level. Power supply signal 111 is received by circuit block 102 where it is distributed to a plurality of sub-circuits via local power supply signals coupled to power supply signal 111.

A voltage sensing system performs a sequence of voltage level comparisons on a plurality of voltage sense signals (block 503). Voltage sense signals 112a-112n are coupled to respective local power supply signals in circuit block 102. Sensing circuit 103, using a plurality of comparison stages, such as, for example, sensing stages 204 in FIG. 2, compares a first pair of voltage sense signals 112 (e.g., 112a and 112b). A selected one of these signals is compared to a next voltage sense signal, such as voltage sense signal 112c (not illustrated in FIG. 1), and so forth until all voltage sense signals 112 have been compared at least once to another voltage sense signals 112.

Further operations of method 500 may depend on a result of a first comparison between a first and a second voltage sense signals (block 504). Sensing circuit 103 compares voltage sense signals 112a and 112b and selects one of the two signals based on a selection criterion. In the illustrated embodiment, voltage levels of voltage sense signals 112a and 112b are compared and the signal with a lower voltage level may be selected. In other embodiments, criteria other than lowest voltage level may be used, as is disclosed above. If voltage sense signal 112a meets the criterion, then method 500 moves to block 505 for signal selection, and otherwise moves to block 506 to select a signal.

If the first voltage sense signal meets the criterion, then the first voltage sense signal is selected (block 505). Voltage sense signal 112a (i.e., the first voltage sense signal) may be selected by sensing stage 204a, for example. Sensing stage 204a generates an output signal corresponding to voltage sense signal 112a and sends it to a sensing stage 204b to be compared to a next voltage sense signal.

If the second voltage sense signal meets the criterion, then the second voltage sense signal is selected (block 506). Voltage sense signal 112b (i.e., the second voltage sense signal) may be selected instead of voltage sense signal 112a by sensing stage 204a. Similar to the description above, sensing stage 204a generates an output signal corresponding to voltage sense signal 112b and sends it to a sensing stage 204b to be compared to a next voltage sense signal.

Subsequent operations of the method may depend on a result of a comparison between a previously selected output voltage sense signal and a last voltage sense signal (block 507). Referring to FIG. 2, a last stage, i.e., sensing stage 204n in the illustrated embodiment, receives and compares voltage levels of output voltage sense signal 214n-1 and voltage sense signal 212n+1. Sensing stage 204n selects one of the two signals based on the selection criterion. It is noted that any number of sensing stages may be included between sensing stage 204a and 204n, including zero stages (i.e., sensing circuit 103 may include only two stages in some embodiments). Blocks 504 through 506 may be repeated for each stage between sensing stage 204a and 204n before operations of block 507 are performed. If output voltage sense signal 214n-1 meets the criterion, then the method moves to block 508 for signal selection, and otherwise moves to block 509 to select a signal for generating a feedback signal.

If the last voltage sense signal meets the criterion, then the last voltage sense signal is selected (block 508). Sensing stage 204n generates feedback signal 213 with a voltage level that corresponds to voltage sense signal 212n+1 and sends this feedback signal to voltage regulator 101.

If the previously selected output voltage sense signal meets the criterion, then the previously selected output voltage sense signal is selected (block 509). If the output voltage sense signal 214n-1 has the lower voltage level during the comparison, then sensing stage 204n generates feedback signal 213 with a voltage level that corresponds to output voltage sense signal 214n-1. Sensing stage 204n then sends feedback signal 213 to voltage regulator 101.

The voltage regulator modifies the regulated voltage level of the power supply signal, using the selected feedback signal (block 510). In the illustrated embodiment, voltage regulator 101 receives feedback signal 213 (which also corresponds to feedback signal 113), and compares a voltage level of feedback signal 213 to at least one reference voltage level. Based on this comparison, voltage regulator 101 may modify the voltage level of power supply signal 111, by, for example, increasing the voltage level if the voltage level of feedback signal 213 is less than the reference voltage level. In some embodiments, voltage regulator 101 may lower a voltage level of power supply signal 111 if the voltage level of feedback signal 213 is greater than a second reference voltage level. The method ends in block 511.

It is noted that the method of FIG. 5 is merely an example. The operations illustrated in method 500 are depicted as being performed serially. In other embodiments, however, some of the operations may be performed in parallel or in a different sequence. In some embodiments, additional operations may be included.

It is also noted that method 500, when performed by circuits disclosed above, may result in a worst case voltage sense signal being selected as a feedback signal to a voltage regulator circuit at a particular point in time. Such a method may allow for an inclusion of more voltage sense signals within a circuit block, therefore, providing a more accurate feedback signal to the voltage regulator circuit. By providing a more accurate feedback signal as compared to traditional methods, the voltage regulator circuit may be designed to regulate at a voltage level that is closer to a threshold operating limit, thereby reducing an amount of operating margin that may otherwise be needed to prevent sub-circuits in the circuit block from crossing the threshold and possibly failing as a result. The disclosed circuits may allow for addition or subtraction of voltage sense signals by adding or subtracting sensing stages, thereby reducing design time of a sensing circuit for a particular number of voltage sense signals.

It is further noted that the systems and circuits described herein may be implemented in any suitable digital logic or mixed-signal process. For example, some embodiments may utilize a Complementary Metal-Oxide Semiconductor Field-Effect Transistor (CMOS) process. Such CMOS logic process may utilize planar devices, non-planar devices, or a combination of the two. Circuits designed in a CMOS process may include various combinations of smaller logic circuits, such as, for example, invertors, AND gates, OR gates, NAND gates, and NOR gates. In addition, as used herein, a "logic level" or "logic signal" corresponds to a signal with a voltage level that indicates one of two states, either a "low logic level" or a "high logic level." A "low logic level" corresponds to a voltage level sufficiently low to enable a p-channel MOSFET, and a "high logic level" corresponds to a voltage level sufficiently high to enable an n-channel MOSFET. In various other embodiments, different technology, including technologies other than complementary metal-oxide semiconductor (CMOS), may result in different voltage levels for indicating a "low" or a "high" logic level.

Numerous variations and modifications will become apparent to those skilled in the art once the above disclosure is fully appreciated. It is intended that the following claims be interpreted to embrace all such variations and modifications.

What is claimed is:

1. A system, comprising:
   a circuit block configured to distribute a power supply signal to a plurality of voltage sense signals;
   a voltage regulator circuit configured to generate a regulated voltage level on the power supply signal; and
   a sensing circuit configured to:
   perform a sequence of comparisons of respective voltage levels of the plurality of voltage sense signals using a selection criterion;
   generate a plurality of logic signals based on the sequence of comparisons;
   wherein to perform the sequence of comparisons, the sensing circuit is further configured to:
   select, using a particular logic signal of the plurality of logic signals, one of either a first voltage sense signal or a second voltage sense signal of the plurality of voltage sense signals to generate a first output voltage sense signal; and
   select, using a different logic signal of the plurality of logic signals, one of either a third voltage sense signal of the plurality of voltage sense signals or a previously generated output voltage sense signal to generate a feedback signal; and
   wherein the voltage regulator circuit is further configured to modify the regulated voltage level using the feedback signal.

2. The system of claim 1, wherein the sensing circuit includes a series of sensing stages, and wherein to select one of either the first voltage sense signal or the second voltage sense signal, a first stage of the series of sensing stages is configured to compare a voltage level of the first voltage sense signal to a voltage level of the second voltage sense signal.

3. The system of claim 2, wherein to select one of either the third voltage sense signal or the previously generated output voltage sense signal, a last stage of the series of sensing stages is configured to compare a voltage level of the third voltage sense signal to a voltage level of the previously generated output voltage sense signal.

4. The system of claim 1, wherein the previously generated output voltage sense signal corresponds to the first output voltage sense signal.

5. The system of claim 1, wherein the circuit block includes a plurality of sub-circuits, and wherein each of the plurality of voltage sense signals corresponds to a power supply signal for a respective one of the plurality of sub-circuits.

6. The system of claim 1, wherein the selection criterion corresponds to a determination of which voltage sense signal has a lower voltage level.

7. The system of claim 6, wherein the feedback signal corresponds to a particular one of the plurality of voltage sense signals with a lowest voltage level.

8. A method, comprising:
   generating, by a voltage regulator circuit, a regulated voltage level on a power supply signal coupled to a plurality of voltage sense signals in a circuit block;
   performing, by a sensing circuit, a sequence of comparisons of respective voltage levels of the plurality of voltage sense signals using a selection criterion;
   generating a plurality of logic signals based on the sequence of comparisons;
   wherein performing the sequence of comparisons comprises:
   selecting, using a particular logic signal of the plurality of logic signals, one of either a first voltage sense signal or a second voltage sense signal of the plurality of voltage sense signals to generate a first output voltage sense signal; and
   selecting, using a different logic signal of the plurality of logic signals, one of either a last voltage sense signal of the plurality of voltage sense signals or a previously generated output voltage sense signal to generate a feedback signal; and
   modifying, by the voltage regulator circuit, the regulated voltage level using the feedback signal.

9. The method of claim 8, wherein selecting one of either the first voltage sense signal or the second voltage sense signal comprises comparing, by a first stage of a series of stages, a voltage level of the first voltage sense signal to a voltage level of the second voltage sense signal.

10. The method of claim 9, further comprising:
    generating the particular logic signal based on the comparison; and
    selecting one of either the first voltage sense signal or the second voltage sense signal based on a logic level of the logic signal.

11. The method of claim 9, wherein selecting one of either the last voltage sense signal or the previously generated output voltage sense signal comprises comparing, by a last stage of the series of stages, a voltage level of the last voltage sense signal to a voltage level of the previously generated output voltage sense signal.

12. The method of claim 11, further comprising selecting one of either the first voltage sense signal or the second voltage sense signal which has a lower voltage level.

13. The method of claim 8, further comprising:
    scaling, by the sensing circuit, a voltage level of the first voltage sense signal and a voltage level of the second voltage sense signal; and
    comparing the scaled voltage level of the first voltage sense signal to the scaled voltage level of the second voltage sense signal.

14. The method of claim 8, further comprising attenuating, by a low pass filter circuit, at least one frequency component included in the first voltage sense signal.

15. An apparatus, comprising:
    a series of sensing stages;
    wherein a first sensing stage of the series of sensing stages is configured to:
    receive a first voltage sense signal and a second voltage sense signal;
    generate a first logic signal based on respective voltage levels of the first voltage sense signal and the second voltage sense signal; and
    select, based on the first logic signal, one of either the first voltage sense signal or the second voltage sense signal to generate a first output voltage sense signal; and
    wherein a second sensing stage of the series of sensing stages is configured to:
    receive a previously generated output voltage sense signal and a third voltage sense signal;

generate a second logic signal based on respective voltage levels of the previously generated output voltage sense signal and the third voltage sense signal; and select, based on the second logic signal, one of either the previously generated output voltage sense signal or the third voltage sense signal to generate a feedback signal.

16. The apparatus of claim 15, wherein the first sensing stage includes a voltage comparator configured to:

compare a voltage level of the first voltage sense signal to a voltage level of the second voltage sense signal; and generate the first logic signal based on the comparison.

17. The apparatus of claim 16, wherein the first sensing stage further includes a voltage reducing circuit configured to:

reduce respective voltage levels of the first voltage sense signal and the second voltage sense signal; and send the first voltage sense signal and the second voltage sense signal with respective reduced voltage levels to the voltage comparator.

18. The apparatus of claim 17, wherein the voltage reducing circuit includes a low pass filter circuit configured to attenuate at least one frequency component included in the first voltage sense signal.

19. The apparatus of claim 15, wherein the first sensing stage includes a multiplexor circuit configured to select, using the first logic signal, either the first voltage sense signal or the second voltage sense signal as the first output voltage sense signal.

20. The apparatus of claim 15, wherein the previously generated output voltage sense signal corresponds to the first output voltage sense signal.

* * * * *